(12) United States Patent
Lang et al.

(10) Patent No.: US 12,207,417 B2
(45) Date of Patent: Jan. 21, 2025

(54) THREE-DIMENSIONAL CIRCUIT BOARD PROCESSING APPARATUS

(71) Applicant: Simetric Semiconductor Solutions Co., Ltd., Guangdong (CN)

(72) Inventors: Marcus Elmar Lang, Guangdong (CN); Kei Ming Yip, Guangdong (CN)

(73) Assignee: Simetric Semiconductor Solutions Co., Ltd., Shenzhen (CN)

( * ) Notice: Subject to any disclaimer, the term of this patent is extended or adjusted under 35 U.S.C. 154(b) by 248 days.

(21) Appl. No.: 18/092,912

(22) Filed: Jan. 3, 2023

(65) Prior Publication Data
US 2024/0224428 A1    Jul. 4, 2024

(51) Int. Cl.
*H05K 3/00*    (2006.01)

(52) U.S. Cl.
CPC ... *H05K 3/0085* (2013.01); *H05K 2203/1518* (2013.01); *H05K 2203/1545* (2013.01); *H05K 2203/1572* (2013.01)

(58) Field of Classification Search
CPC .................................................. H05K 3/0085
See application file for complete search history.

(56) References Cited

U.S. PATENT DOCUMENTS 5,711,806 A * 1/1998 Harnden ............. H05K 3/0088
                                                     118/425

\* cited by examiner

*Primary Examiner* — Jason Y Ko

(57) ABSTRACT

The present invention discloses a three-dimensional circuit board processing apparatus, including an input module, a vertical processing module, and an output module, which are arranged in sequence. The vertical processing module includes a conveying unit and a processing assembly. A vertical conveying port is arranged on each of two sides of the vertical processing module. The input module is connected to one end of the conveying unit, and the output module is connected to another end of the conveying unit. The input module and/or the output module are/is a flippable module. According to embodiments of the present invention, by arranging the flippable input module and/or output module, the circuit board may enter and exit the vertical processing module vertically, and may be uniformly processed through the vertical processing module, thereby enhancing the processing quality of the circuit board and improving the automation performance of three-dimensional processing.

10 Claims, 4 Drawing Sheets

THREE-DIMENSIONAL CIRCUIT BOARD PROCESSING APPARATUS

STATEMENT REGARDING PRIOR DISCLOSURES BY AN INVENTOR OR JOINT INVENTOR

The contents of Chinese Patent Application No. 202121781558.X filed on Aug. 2, 2021 and published on Jan. 4, 2022, is a grace period disclosure and shall not be prior art to claimed invention.

TECHNICAL FIELD

The present invention relates to the technical field of circuit board production, and in particular, to a three-dimensional circuit board processing apparatus.

BACKGROUND

The development of new products in the electronic industry imposes increasingly high requirements for machine technologies required to manufacture these products. Although horizontal machines with conveying portion systems are still used in traditional circuit board production, these machines no longer meet the demand in a high-end circuit board and IC substrates. Two problems exist in the production process of the horizontal machines. On the one hand, in terms of process engineering, in the production process of the high-end circuit board or the IC substrate, a processing difference exists in the vertical space due to the horizontal processing of machines. For example, a significant difference exists in the effect of flow characteristics and ion exchange and spray on both sides of the high-end circuit board or the IC substrate, which, in terms of process results, is manifested as a significant difference in quality. On the other hand, the transmission system will have an impact on the current increasingly sophisticated product structure, which has a negative impact on the output of the high-end circuit board or the IC substrate.

In order to solve the above problems in the manufacture of high-end products, a vertical machine tool is adopted in the prior art. A vertical machine tool is mainly used for manufacturing the IC substrate. In terms of the process, the advantage of the vertical machine technology is that the conditions on both sides of a to-be-processed panel are the same, and the so-called frame is used to fix the panel, which greatly reduces the risk of mechanical damage caused by the conveying system on the product. However, the disadvantage of this method is that high requirements are imposed on the cost and space of the machine itself, and automation and operation costs are required. Therefore, such machine technology is only used for processes which a conventional horizontal machine technology is unable to complete.

SUMMARY

Embodiments of the present invention provide a three-dimensional circuit board processing apparatus, which is intended to improve the automation performance of three-dimensional processing of a circuit board.

An embodiment of the present invention provides a three-dimensional circuit board processing apparatus, including an input module configured to input a circuit board, a vertical processing module, and an output module configured to output the circuit board, which are arranged in sequence. The vertical processing module includes a conveying unit configured to vertically convey the circuit board and a processing assembly configured to process the circuit board. A vertical conveying port is arranged on each of both sides of the vertical processing module. The input module is connected to one end of the conveying unit through the conveying port on one side, and the output module is connected to another end of the conveying unit through the conveying port on the other side. The input module and/or the output module are/is a flippable module.

Further, the input module, the conveying unit, and the output module each include a roller bed conveying portion, each roller bed conveying portion includes two rows of roller bed sets arranged at intervals in parallel on two sides of a conveying direction of the circuit board, each of the roller bed sets includes a plurality of roller beds, and the roller bed conveying portion of the conveying unit is vertically arranged.

Further, the processing assembly includes nozzles arranged on two outer sides of the roller bed conveying portion and a liquid collecting tank arranged below the vertical processing module, and the nozzles are in communication with the liquid collecting tank.

Further, the three-dimensional circuit board processing apparatus further includes a plurality of water spraying columns arranged on the two outer sides of the roller bed conveying portion, each of the water spraying columns is in communication with the liquid collecting tank, and the nozzle is arranged on the water spraying column.

Further, at least two nozzles are vertically and equidistantly arranged on each water spraying column.

Further, rollers are arranged on each of the roller beds.

Further, the input module and/or the output module include/includes a flippable roller bed support, and at least two sets of roller bed conveying portions are installed in the roller bed support.

Further, each set of roller bed conveying portions are uniformly distributed.

Further, the overlapping roller beds configured to convey the circuit boards are arranged at an intersection of the at least two sets of roller bed conveying portions.

Further, two sets of roller bed conveying portions are installed in the roller bed support perpendicular to each other.

An embodiment of the present invention provides a three-dimensional circuit board processing apparatus, including an input module configured to input a circuit board, a vertical processing module, and an output module configured to output the circuit board, which are arranged in sequence. The vertical processing module includes a conveying unit configured to vertically convey the circuit board and a processing assembly configured to process the circuit board. A vertical conveying port is arranged on each of both sides of the vertical processing module. The input module is connected to one end of the conveying unit through the conveying port on one side, and the output module is connected to another end of the conveying unit through the conveying port on the other side. The input module and/or the output module are/is a flippable module. According to the embodiments of the present invention, by arranging the flippable input module and/or output module, the circuit board may enter and exit the vertical processing module vertically, and may be uniformly processed through the vertical processing module, thereby enhancing the processing quality of the circuit board and improving the automation performance of three-dimensional processing.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show only some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are some of the embodiments of the present invention rather than all of the embodiments. All other embodiments obtained by a person skilled in the art based on the embodiments of the present invention without creative efforts shall fall within the protection scope of the present invention.

It is to be understood that when used in the specification and the appended claims, the terms "include" and "comprise" indicate the presence of described features, wholes, steps, operations, elements and/or components, but do not exclude the presence or addition of one or more other features, wholes, steps, operations, elements, components and/or a set thereof.

It is further to be understood that terms used in the specification of the present invention are merely for the purpose of describing specific embodiments, but are not intended to limit the present invention. As used in the specification and the appended claims of the present invention, singular terms "a", "an" and "the" are intended to include plural forms unless the context clearly indicates otherwise.

It is to be further understood that a term "and/or" used in the specification and the appended claims of the present invention refers to one or more of any and all possible combinations of the associated items that is listed and includes the combinations.

Figure 1:
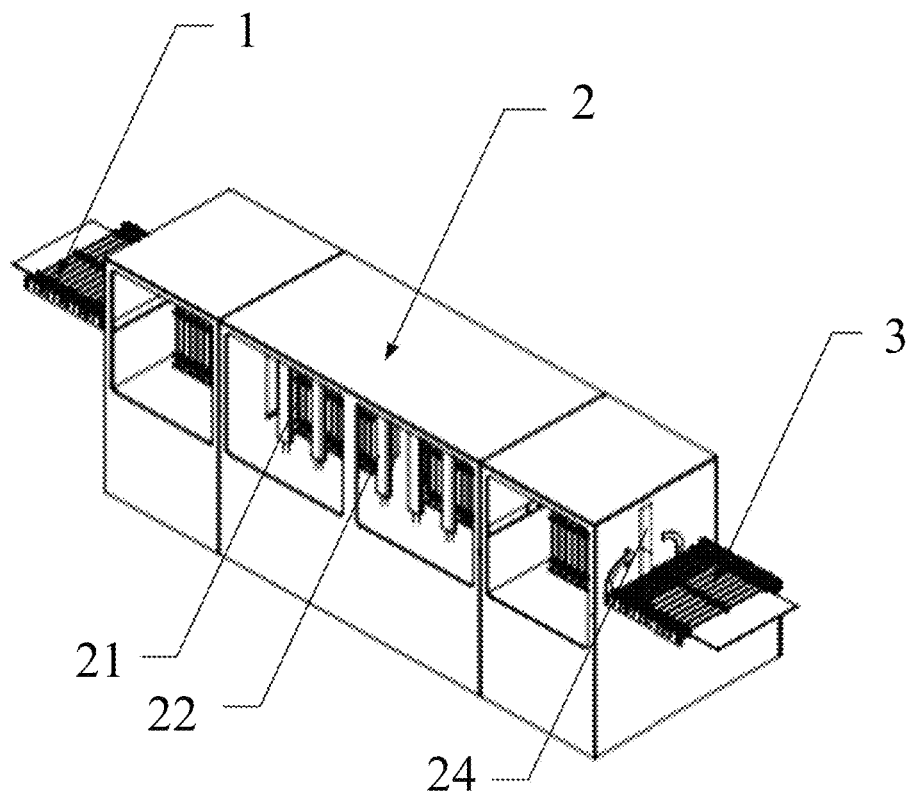
FIG. 1 is a schematic structural diagram of a three-dimensional circuit board processing apparatus according to an embodiment of the present invention.

Refer to FIG. 1 below. FIG. 1 is a schematic structural diagram of a three-dimensional circuit board processing apparatus according to an embodiment of the present invention. The three-dimensional circuit board processing apparatus includes an input module 1 configured to input a circuit board, a vertical processing module 2, and an output module 3 configured to output the circuit board, which are arranged in sequence. The vertical processing module 2 includes a conveying unit 21 configured to vertically convey the circuit board and a processing assembly configured to process the circuit board. A vertical conveying port 24 is arranged on each of both sides of the vertical processing module 2. The input module 1 is connected to one end of the conveying unit 21 through the conveying port 24 on one side, and the output module 3 is connected to another end of the conveying unit 21 through the conveying port 24 on the other side. The input module 1 and/or the output module 3 are/is a flippable module.

Figure 2:
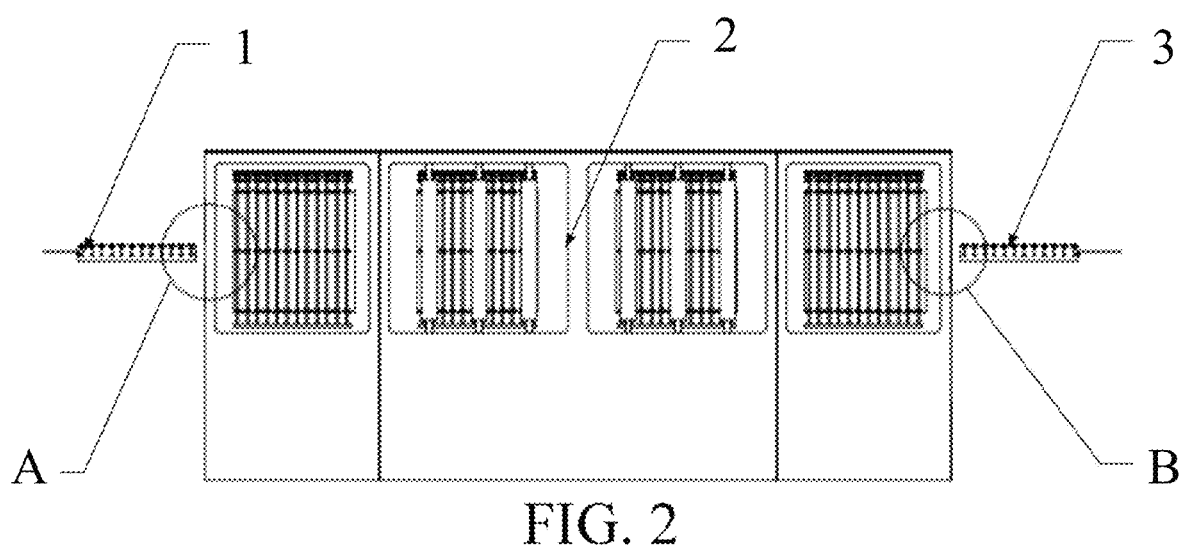
FIG. 2 is a schematic cross-sectional view of a three-dimensional circuit board processing apparatus according to an embodiment of the present invention.
Figure 3:
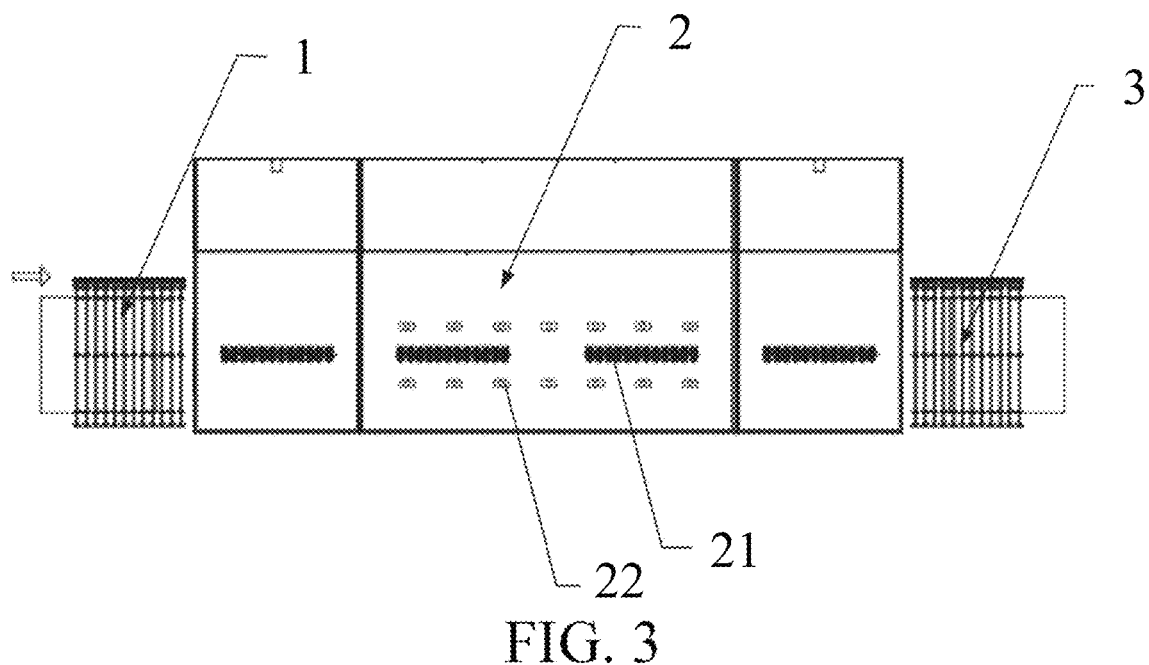
FIG. 3 is a schematic structural diagram of a three-dimensional circuit board processing apparatus according to an embodiment of the present invention from another angle.

In this embodiment, with reference to FIG. 2 and FIG. 3, the three-dimensional circuit board processing apparatus includes an input module 1, a vertical processing module 2, and an output module 3 in sequence according to a conveying direction of the circuit board. The input module 1 and/or the output module 3 are/is a flippable module. For example, the input module 1 may be flipped from a horizontal direction to a vertical direction, so that the circuit board on the input module 1 is flipped from the horizontal direction to the vertical direction, and then enters the vertical processing module 2 from the vertical conveying port 24 of the vertical processing module 2. Similarly, the output module 3 may also be flipped from the horizontal direction to the vertical direction, so that the vertical circuit board in the vertical processing module 2 enters the conveying module 3 through the vertical conveying port 24. The vertical processing module 2 includes a vertical conveying unit 21. In the process of conveying the circuit board from a side of the input module 1 to a side of the output module 3 through the conveying unit 21, the circuit board is processed by the processing assembly, so that the circuit board can be uniformly processed in the vertical direction and the horizontal direction.

In the embodiment, by arranging the flippable input module 1 and/or output module 3, the circuit board may enter and exit the vertical processing module 2 vertically, and may be uniformly processed through the vertical processing module 2, thereby enhancing the processing quality of the circuit board and improving the automation performance of three-dimensional processing. In addition, the circuit board described in this embodiment is a high-end product such as an IC substrate and a high-end circuit board (for example, a multilayer circuit board) in electronic manufacturing.

The embodiment of the present invention belongs to the integrated circuit manufacturing part in the electronic core industry, that is, an integrated circuit is processed and produced by the three-dimensional circuit board processing apparatus provided in the embodiment of the present invention. The three-dimensional circuit board processing apparatus provided in the embodiment of the present invention may further be used for manufacturing special-purpose equipment for producing a semiconductor device such as a special mask aligner, an etching machine, and the like.

In an embodiment, the input module 1, the conveying unit 21, and the output module 3 each include a roller bed conveying portion. Each roller bed conveying portion includes two rows of roller bed sets arranged at intervals in parallel on two sides of a conveying direction of the circuit board. Each of the roller bed sets includes a plurality of roller beds, and the roller bed conveying portion of the conveying unit is vertically arranged.

In this embodiment, the circuit board is conveyed by the roller bed conveying portion, and in addition, each roller conveying portion includes two roller bed sets, and the circuit board may be fixed by the two roller bed sets. In addition, the manner of fixing the circuit board by the roller bed set can leave a processing space for processing the circuit board, thereby satisfying the processing requirement.

In the prior art, a frame is usually used to fix the circuit board on the input module 1 or the output module 3. Compared with this, in this embodiment, the effect of fixing the circuit board is achieved while the circuit boards are conveyed through roller bed sets on both sides, which not only improves the automation performance, but also saves the manufacturing cost.

Figure 4:
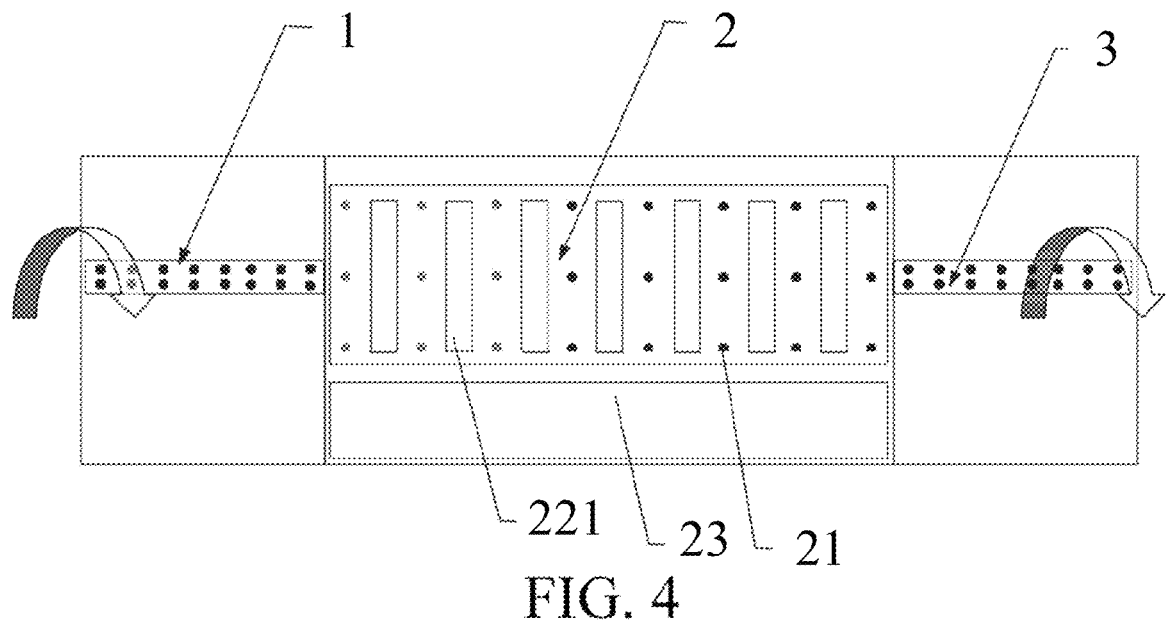
FIG. 4 is a schematic structural diagram of a three-dimensional circuit board processing apparatus according to an embodiment of the present invention from another angle.

In an embodiment, with reference to FIG. 4, the processing assembly includes nozzles 221 arranged on two outer sides of the roller bed conveying portion and a liquid collecting tank 23 arranged below the vertical processing module. The nozzles 221 are in communication with the liquid collecting tank 23.

In this embodiment, the nozzle 221 is arranged outside the roller bed conveying portion of the conveying unit 21, and is used for spraying the circuit boards in the middle of the two roller bed sets. It may be understood that the outer side in this embodiment is a side away from the circuit board. In addition, the liquid collecting tank 23 is arranged below the vertical processing module 2, which is convenient for the nozzle 221 to draw the spraying liquid nearby, and can also have the effect of fixing the bottom of the circuit board.

Further, in an embodiment, the three-dimensional circuit board processing apparatus further includes a plurality of water spraying columns 22 arranged on the two outer sides of the roller bed conveying portion. Each of the water spraying columns 22 is in communication with the liquid collecting tank 23, and the nozzle 221 is arranged on the water spraying column 22.

In this embodiment, the water spraying column 22 is arranged outside the roller bed conveying portion of the conveying unit 21, and the nozzle 221 is formed on the water spraying column 22, which not only can achieve the effect of spray processing, but also can support and stabilize the vertical processing module 2 through the water spraying column 22.

Further, in an embodiment, at least two nozzles 221 are vertically and equidistantly arranged on each water spraying column 22. In a specific application scenario, three nozzles 221 are vertically and equidistantly arranged on each water spraying column 22. Certainly, in other application scenarios, a corresponding number of nozzles 221 may also be arranged according to specific requirements.

In an embodiment, rollers are arranged on each of the roller beds.

Figure 5:
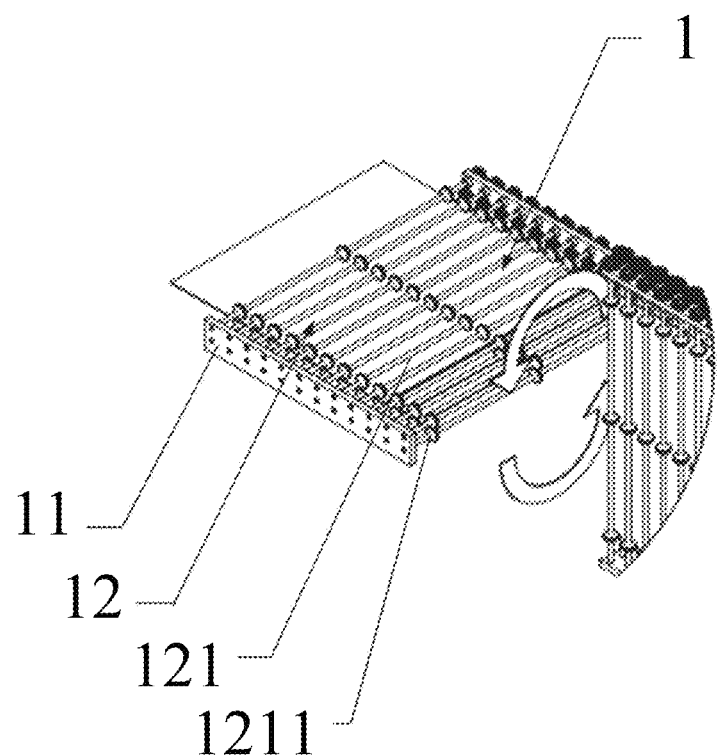
FIG. 5 is an enlarged schematic diagram of a part A in FIG. 2.
Figure 6:
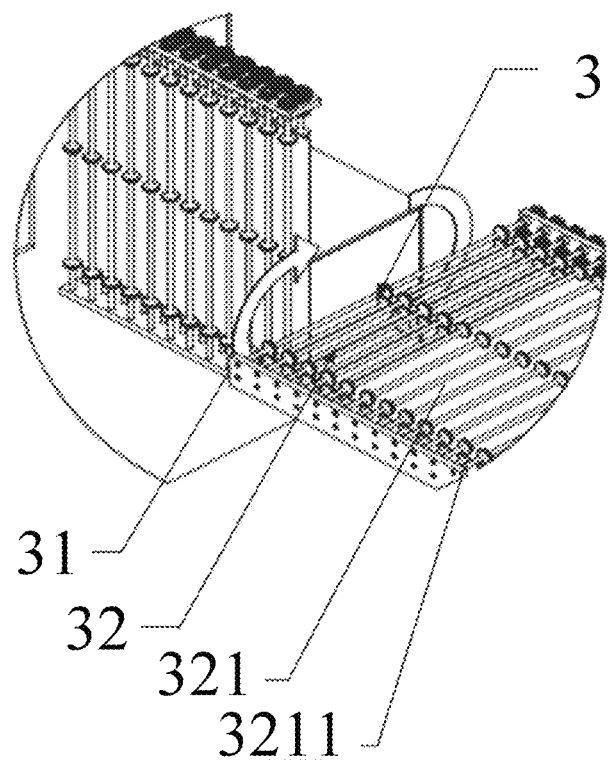
FIG. 6 is an enlarged schematic diagram of a part B in FIG. 2.

In this embodiment, with reference to FIG. 5 and FIG. 6, a plurality of rollers (such as 1211 in FIGS. 5 and 3211 in FIG. 6) are arranged on each roller bed (such as 121 in FIGS. 5 and 321 in FIG. 6) to facilitate conveying of the circuit board and fixing of the circuit board, so as to prevent the circuit board from shaking or being stuck during the processing.

In an embodiment, the input module 1 and/or the output module 3 include/includes a flippable roller bed support (such as 11 in FIGS. 5 and 31 in FIG. 6), and at least two sets of intersecting roller bed conveying portions (such as 12 in FIGS. 5 and 32 in FIG. 6) are installed in the roller bed support.

In this embodiment, the input module 1 and/or the output module 3 can be flipped by arranging the flippable roller bed support on the input module 1 and/or the output module 3. In addition, the roller bed conveying portion is arranged on the roller bed support, and at least two sets of intersecting roller bed conveying portions are installed on the roller bed support. In this way, a plurality of circuit boards can be conveyed simultaneously, and the processing efficiency and production efficiency of the circuit boards are greatly improved.

Figure 7:
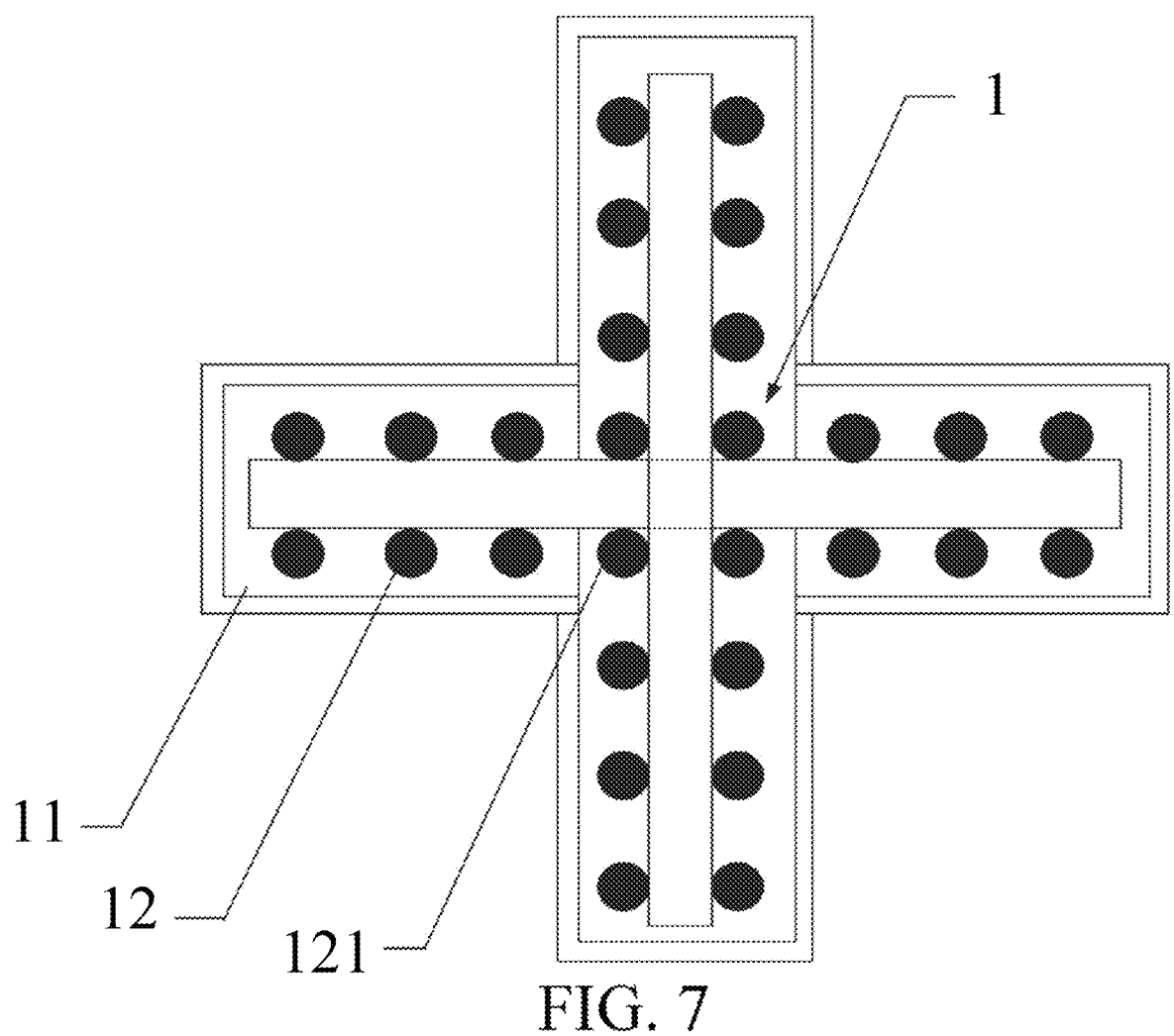
FIG. 7 is a schematic diagram of distribution of roller bed conveying portions of an input module in a three-dimensional circuit board according to an embodiment of the present invention.

Further, in an embodiment, each set of roller bed conveying portions are uniformly distributed. For example, as shown in FIG. 7, when two sets of roller bed conveying portions are installed, the two sets of roller bed conveying portions may be in a cross-shaped distribution, that is, two sets of roller bed conveying portions arranged perpendicular to each other. In another example, when eight sets of roller bed conveying portions are installed, the eight sets of roller bed conveying portions may be uniformly distributed in shape of a Chinese character "※". That is to say, no matter how many sets of roller bed conveying portions are arranged, angles between adjacent roller bed conveying portions can be the same, thereby achieving the effect of uniform distribution.

In an embodiment, the overlapping roller beds configured to convey the circuit boards are arranged at an intersection of the at least two sets of roller bed conveying portions.

In this embodiment, overlapping roller beds exist between each roller bed conveying portion and other roller bed conveying portions. That is to say, each roller bed conveying portion is required to convey the circuit board in sequence in chronological order, so as to prevent the plurality of circuit boards from entering and exiting the vertical processing module simultaneously, resulting in the inability to process the circuit boards normally. Certainly, it may be understood that, in this embodiment, the roller beds, which overlap and convey the circuit boards, at the intersection of the at least two sets of roller bed conveying portions are the roller bed conveying portions on the input module and/or the output module, but not the roller bed conveying portions of the conveying units of the vertical processing module.

The embodiments in the specification are all described in a progressive manner. Description of each of the embodiments focuses on differences from other embodiments, and reference may be made to each other for the same or similar parts among the embodiments. The system disclosed in the embodiments is described relatively simply because it corresponds to the method disclosed in the embodiments, and for portions related to those of the method, reference may be made to the description of the method. It should be noted that a person of ordinary skill in the art may further make several improvements and modifications without departing from the principle of this application. These improvements and modifications also fall within the protection scope of the claims of this application.

It should be further noted that the relational terms in the specification such as first and second are used only to differentiate an entity or operation from another entity or operation, and do not require or imply any actual relationship or sequence between these entities or operations. Furthermore, the terms "include", "comprise" or any other variants are intended to cover a non-exclusive inclusion, so that a process, a method, an article or a device that includes a list of elements not only includes those elements but also includes other elements that are not expressly listed, or further includes elements inherent to such a process, method, article, or device. Without any further limitation, an element defined by the phrase "including one . . . " does not exclude existence of other same elements in the process, the method, the article, or the device that includes the elements.

What is claimed is:

1. A three-dimensional circuit board processing apparatus, comprising an input module configured to input a circuit board, a vertical processing module, and an output module configured to output the circuit board, which are arranged in sequence, the vertical processing module comprises a conveying unit configured to vertically convey the circuit board and a processing assembly configured to process the circuit board; a vertical conveying port is arranged on each of two sides of the vertical processing module, the input module is connected to one end of the conveying unit through the conveying port on one side, the output module is connected to another end of the conveying unit through the conveying port on the other side, and the input module and/or the output module are/is a flippable module.

2. The three-dimensional circuit board processing apparatus according to claim 1, wherein the input module, the conveying unit, and the output module each comprise a roller bed conveying portion, each roller bed conveying portion comprises two rows of roller bed sets arranged at intervals in parallel on two sides of a conveying direction of the circuit board, each of the roller bed sets comprises a plurality of roller beds, and the roller bed conveying portion of the conveying unit is vertically arranged.

3. The three-dimensional circuit board processing apparatus according to claim 2, wherein the processing assembly comprises nozzles arranged on two outer sides of the roller bed conveying portion and a liquid collecting tank arranged below the vertical processing module, and the nozzles are in communication with the liquid collecting tank.

4. The three-dimensional circuit board processing apparatus according to claim 3, further comprising a plurality of water spraying columns arranged on the two outer sides of the roller bed conveying portion, each of the water spraying columns is in communication with the liquid collecting tank, and the nozzle is arranged on the water spraying column.

5. The three-dimensional circuit board processing apparatus according to claim 4, wherein at least two nozzles are vertically and equidistantly arranged on each water spraying column.

6. The three-dimensional circuit board processing apparatus according to claim 2, wherein rollers are arranged on each of the roller beds.

7. The three-dimensional circuit board processing apparatus according to claim 2, wherein the input module and/or the output module comprise/comprises a flippable roller bed support, and at least two sets of roller bed conveying portions are installed in the roller bed support in an intersected manner.

8. The three-dimensional circuit board processing apparatus according to claim 7, wherein each set of roller bed conveying portions are uniformly distributed.

9. The three-dimensional circuit board processing apparatus according to claim 8, wherein overlapping roller beds configured to convey the circuit board are arranged at an intersection of the at least two sets of roller bed conveying portions.

10. The three-dimensional circuit board processing apparatus according to claim 9, wherein two sets of roller bed conveying portions are installed in the roller bed support perpendicular to each other.

* * * * *